United States Patent
Yoshida

Patent Number: 6,031,985
Date of Patent: Feb. 29, 2000

[54] METHOD, APPARATUS AND SYSTEM FOR ANALYZING FAILURE OF MEASURED DEVICE

[75] Inventor: Eiji Yoshida, Tokyo, Japan

[73] Assignee: Mitsubishi Denki Kabushiki Kaisha, Tokyo, Japan

[21] Appl. No.: 08/778,274

[22] Filed: Jan. 2, 1997

[30] Foreign Application Priority Data

Aug. 21, 1996 [JP] Japan .................................. 8-219758

[51] Int. Cl.⁷ .................................................. G01N 21/66
[52] U.S. Cl. .................................. 395/500.27; 250/492.2
[58] Field of Search .............................. 395/500.27

[56] References Cited

U.S. PATENT DOCUMENTS

| | | | |
|---|---|---|---|
| 5,175,495 | 12/1992 | Brahme et al. | 324/158 |
| 5,391,885 | 2/1995 | Imataki et al. | 250/492.2 |
| 5,661,520 | 8/1997 | Bruce | 348/92 |

FOREIGN PATENT DOCUMENTS

| | | |
|---|---|---|
| 0 226 494 | 6/1987 | European Pat. Off. . |
| 0 667 535 | 8/1995 | European Pat. Off. . |
| 195 26 194 | 2/1996 | Germany . |
| 63-305265 | 12/1988 | Japan . |
| 6-281700 | 10/1994 | Japan . |
| 7-240446 | 9/1995 | Japan . |
| WO 90/15340 | 12/1990 | WIPO . |

OTHER PUBLICATIONS

Stefano Concina, et al., Elekrtonik, vol. 15, pp. 47–56, "Rechnergestützter E–Beam–Chiptest", Jul. 24, 1997.

*Primary Examiner*—Kevin J. Teska
*Assistant Examiner*—Thuan Do
*Attorney, Agent, or Firm*—Oblon, Spivak, McClelland, Maier & Neustadt, P.C.

[57] ABSTRACT

A method for analyzing failures and an apparatus for analyzing failures are provided in which failed portions can easily be specified with high precision in a short time by using an emission analyzing apparatus without analyzers depending on designers. The coordinates of an emitting portion on an emission image which is detected by an emission analyzing apparatus are automatically recognized (Step S5). The same coordinates are automatically converted into the coordinates on a layout pattern (data) (Step S7). An emitting portion on a layout pattern is automatically displayed (Step S11). The name of a node on a net list (data) of the emitting portion is automatically recognized according to the coordinates on the layout pattern (Step S12). The name of an emitting node is automatically displayed on a net list (Step S13). Furthermore, an emitting node on a circuit diagram (data) is automatically displayed as an emitting portion on a circuit diagram based on the emitting node name (Step S15).

11 Claims, 7 Drawing Sheets

METHOD, APPARATUS AND SYSTEM FOR ANALYZING FAILURE OF MEASURED DEVICE

BACKGROUND OF THE INVENTION

1. Field of the Invention

The present invention relates to a failure analyzing method and apparatus for rapidly specifying, with high precision, the failed portion of a measured device (semiconductor device) by using an emission analyzing apparatus.

2. Description of the Background Art

Recently, the technique for analyzing the failures of a semiconductor device, for example, a method for rapidly specifying failed portions with high precision has had great weight. In order to specify the failed portions of the semiconductor device which will become large-scaled, complicated and increased in speed in the future, it is also necessary to examine the information of an internal circuit as well as defective information output to the outside.

As one of semiconductor analyzing apparatus for examining the information of the internal circuit, there is an emission analyzing apparatus for specifying failed portions by detecting faint light emitted in a measured device (semiconductor device). The emission analyzing apparatus serves to detect light emission by hot carriers or the like generated in the minute current leakage portions in the device and the like when operating the measured device (semiconductor device). In order to analyze, in detail, the emitting portions (failed portions) in the measured device (semiconductor device) which are detected in the emission analyzing apparatus, it is necessary for an analyzer to recognize the positions of the emitting portions on CAD data such as a layout diagram or a circuit diagram.

At present, the failed portions are analyzed by the cooperation of the designer of the measured device (semiconductor device). It is expected that the semiconductor device will become more large-scaled and complicated to cause harder failure analysis in the future. Consequently, it is more necessary to easily specify the failed portions with high precision in a short time by using the semiconductor analyzing apparatus such as the emission analyzing apparatus.

However, a method for analyzing failed portions by using the emission analyzing apparatus according to the prior art has a problem that failure analysis is always performed very inefficiently because the designer's cooperation is required.

SUMMARY OF THE INVENTION

A first aspect of the present invention is directed to a method for analyzing the failure of a measured device, comprising the steps of (a) setting a predetermined two-dimensional position to an origin in the measured device, (b) obtaining an emission image when operating the measured device by using an emission analyzing apparatus to detect the emitting portion of the measured device according to the emission image, and (c) recognizing measured device emitting coordinates which are the coordinates of the emitting portion from the origin on the basis of the positional relationship between the emission image and the origin.

A second aspect of the present invention is directed to the method for analyzing the failure of a measured device, further comprising the steps of (d) recognizing the relative positional relationship between a layout pattern, which corresponds to the measured device, and the measured device, (e) recognizing a position of the emitting portion on the layout pattern on the basis of the relative positional relationship recognized at the step (d), and (f) displaying the position of the emitting portion on the layout pattern in such a manner that it can be recognized visually.

A third aspect of the present invention is directed to the method for analyzing the failure of a measured device that may further comprise the steps of (g) recognizing an emitting node on a net list which is equivalent to the emitting portion on the basis of layout pattern—net list corresponding information which defines the relationship between the net list and the layout pattern which correspond to the measured device, and (h) displaying the emitting node on the net list in such a manner that it can be recognized visually.

A fourth aspect of the present invention is directed to the method for analyzing the failure of a measured device that may further comprise the steps of (i) recognizing a position on a circuit diagram which is equivalent to the emitting node on the basis of net list—circuit diagram corresponding information which defines the relationship between the circuit diagram and the net list which correspond to the measured device, and (j) displaying the emitting portion on the circuit diagram in such a manner that it can be recognized visually.

A fifth aspect of the present invention is directed to the method for analyzing the failure of a measured device that may further comprise the steps of (g) recognizing an emitting node on a circuit diagram which is equivalent to the emitting portion on the basis of layout pattern—circuit diagram corresponding information which defines the relationship between the circuit diagram and the layout pattern which correspond to the measured device, and (h) displaying the emitting node on the circuit diagram in such a manner that it can be recognized visually.

A sixth aspect of the present invention is directed to a failure analyzing apparatus, comprising electron beam testing means for irradiating electron beams onto a measured device to detect secondary electrons generated in a portion onto which the electron beams are irradiated, and testing the measured device on the basis of the detected secondary electrons, emitting portion detecting means for obtaining the emission image of the measured device during operation to detect the emitting portion of the measured device according to the emission image, and housing means for housing the electron beam testing means and the emitting portion detecting means in such a manner that the test can be executed by the electron beam testing means and the emitting portion can be detected by the emitting portion detecting means under the same environment for the same measured device.

A seventh aspect of the present invention is directed to a failure analyzing system comprising a plurality of failure analyzing apparatuses which can analyze the failure of a measured device respectively, the plurality of failure analyzing apparatuses including at least one failure analyzing apparatus for emission images which can obtain emission images during the operation of the measured device to execute a method for analyzing the failure of a measured device on the basis of the emission images, the method comprising the steps of (a) setting a predetermined two dimensional position to an origin in the measured device, (b) obtaining an emission image when operating the measured device by using an emission analyzing apparatus to detect the emitting portion of the measured device according to the emission image, and (c) recognizing measured device emitting coordinates which are the coordinates of the emitting portion from the origin on the basis of the positional relationship between the emission image and the origin, wherein a network is formed among the plurality of failure analyzing apparatuses.

An eighth aspect of the present invention is directed to the failure analyzing system, wherein a failure analyzing program, which can execute the method for analyzing the failure of a measured device may be shared on the network.

According to the first aspect of the present invention, the measured device emitting coordinates which act as the coordinates from the origin of the emitting portion are recognized on the basis of the positional relationship between the emission image and the origin at the step (c). By using the measured device emitting coordinates as analytic materials, the failed portion can be specified with high precision by the emission analyzing apparatus without analyzers depending on designers.

At the step (c), an automatic processing can be performed by using a computer and the like. Consequently, the failed portion of the measured device can be specified easily in a short time.

According to the second aspect of the present invention, the relative positional relationship between the layout pattern and the measured device is recognized at the step (d), and the position on the layout pattern of the emitted portion is recognized at the step (e) based on the relative positional relationship which is recognized at the step (d), and the position of the emitting portion on the layout pattern is displayed in such a manner that it can be recognized visually at the step (f).

Accordingly, the emitting portion on the layout pattern can be used as the analytic material to specify the failed portion with high precision by the emission analyzing apparatus without analyzers depending on designers.

At the steps (d) to (f), automatic processings can be performed by using a computer and the like. Consequently, the failed portion of the measured device can be specified easily in a short time.

According to the third aspect of the present invention, the emitting node on the net list which is equivalent to the emitting portion is recognized on the basis of the layout pattern—net list corresponding information at the step (g), and the emitting node on the net list is displayed in such a manner that it can be recognized visually at the step (h).

Accordingly, the emitting node on the net list can be used as the analytic material to specify the failed portion with high precision by the emission analyzing apparatus without analyzers depending on designers.

At the steps (g) and (h), automatic processings can be performed by using a computer and the like. Consequently, the failed portion of the measured device can be specified easily in a short time.

According to the fourth aspect of the present invention, the position on the circuit diagram which is equivalent to the emitting node is recognized on the basis of the net list—circuit diagram corresponding information at the step (i), and the emitting node on the circuit diagram is displayed in such a manner that it can be recognized visually at the step (j).

Accordingly, the emitting node on the circuit diagram can be used as the analytic material to specify the failed portion with high precision by the emission analyzing apparatus without analyzers depending on designers.

At the steps (i) and (j), automatic processings can be performed by using a computer and the like. Consequently, the failed portion of the measured device can be specified easily in a short time.

According to the fifth aspect of the present invention, the emitting node on the circuit diagram which is equivalent to the emitting portion is recognized on the basis of the layout pattern—circuit diagram corresponding information at the step (g), and the emitting node on the circuit diagram is displayed in such a manner that it can be recognized visually at the step (h).

Accordingly, the emitting node on the circuit diagram can be used as the analytic material to specify the failed portion with high precision by the emission analyzing apparatus without analyzers depending on designers.

At the steps (g) and (h), automatic processings can be performed by using a computer and the like. Consequently, the failed portion of the measured device can be specified easily in a short time.

Furthermore, the emitting node on the circuit diagram is directly recognized according to the emitting portion on the layout pattern without using the net list. Consequently, the time can be reduced.

According to the sixth aspect of the present invention, the housing means houses the electron beam testing means and the emitting portion detecting means in such a manner that the test can be executed by the electron beam testing means and the emitting portion can be detected by the emitting portion detecting means under the same environment for the same measured device.

Accordingly, it is possible to switch the test executed by the electron beam testing means and the detection of the emitting portion performed by the emitting portion detecting means under the same environment for the same measured device.

As a result, cost can be reduced by the unification of the failure analyzing apparatus. In addition, analysis can be performed rapidly, efficiently and easily and operating properties can be enhanced by the uniformity of the environment for analysis.

According to the seventh aspect of the present invention, the network is formed among a plurality of failure analyzing apparatuses which can analyze the failures of the measured device, respectively. Consequently, the exchange of coordinate data of the failed portion and the like is performed bidirectionally among the failure analyzing apparatuses so that the failure analyzing information detected by each failure analyzing apparatus can be shared immediately. Thus, it is possible to perform failure analysis rapidly, efficiently and easily.

According to the eighth aspect of the present invention, the failure analyzing program which can be executed by the method for analyzing the failure of a measured device as defined in any of the first to fifth aspects of the present invention is shared on the network. Consequently, the failure analyzing apparatus can execute the failure analyzing program based on the emission images detected by the failure analyzing apparatus for emission images, respectively. Thus, the environment for failure analysis is unified and the failure analyzing program is shared so that cost can be reduced.

In order to solve the above-mentioned problems, it is an object of the present invention to provide a failure analyzing method and apparatus for easily specifying, with high precision, the failed portion of a measured device (semiconductor device) in a short time by using an emission analyzing apparatus without analyzers designers so as to correspond to the semiconductor device which has become increasingly large-scaled and complicated.

These and other objects, features, aspects and advantages of the present invention will become more apparent from the

DESCRIPTION OF THE PREFERRED EMBODIMENTS

<First Embodiment>

Figure 1:
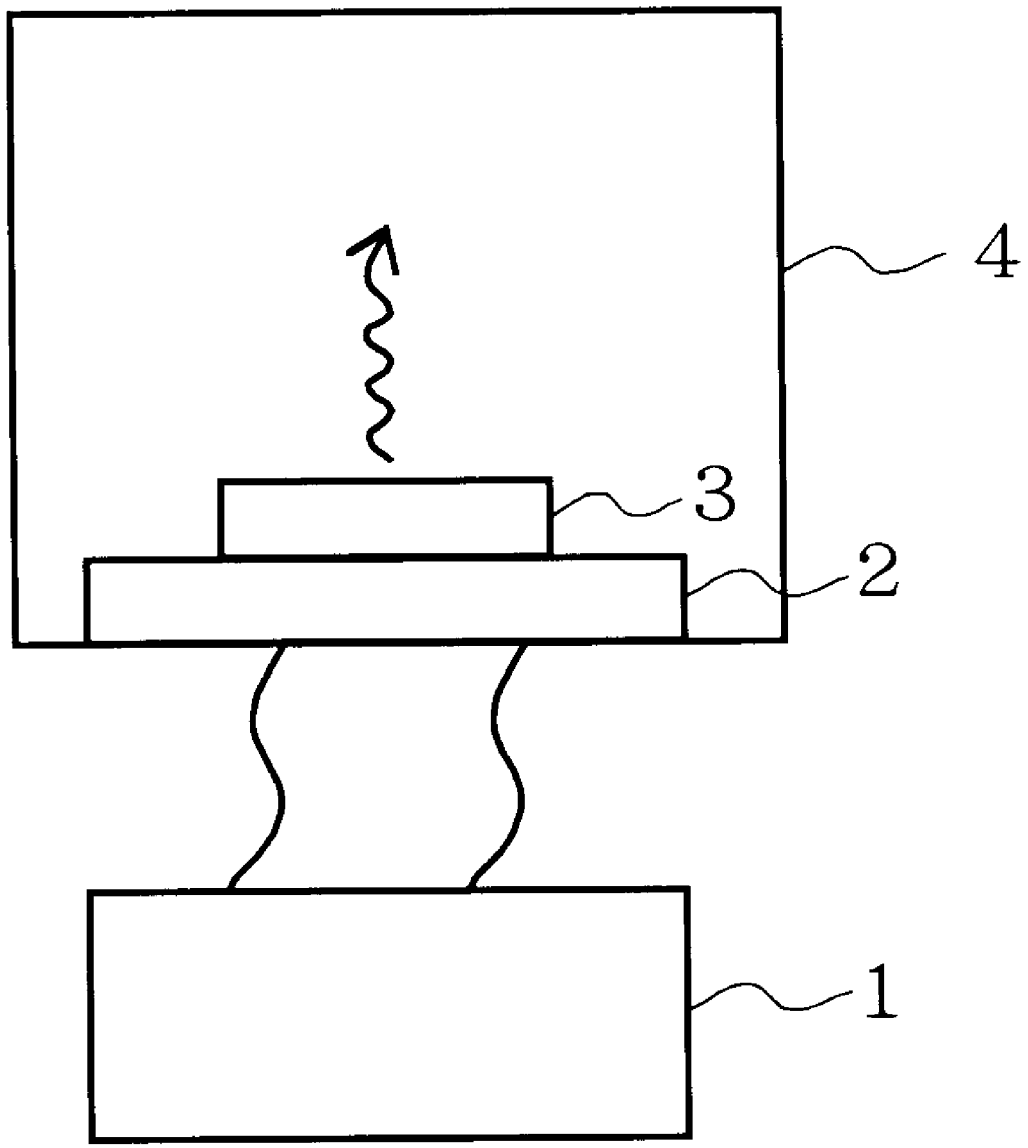
FIG. 1 is a diagram showing the structure of an emission analyzing apparatus to be used for a failure analyzing method according to a first embodiment of the present invention.

FIG. 1 is a diagram showing the structure of an emission analyzing apparatus to be used for a failure analyzing method according to a first embodiment of the present invention. As shown in FIG. 1, a measured device (semiconductor device) 3 is provided on a DUT board 2. An emission analyzing apparatus 4 detects faint light emitted from failed portions (for example, minute current leakage portions and the like) in the measured device 3 which is driven and operated by a test pattern input from a test pattern generator 1.

Figure 2:
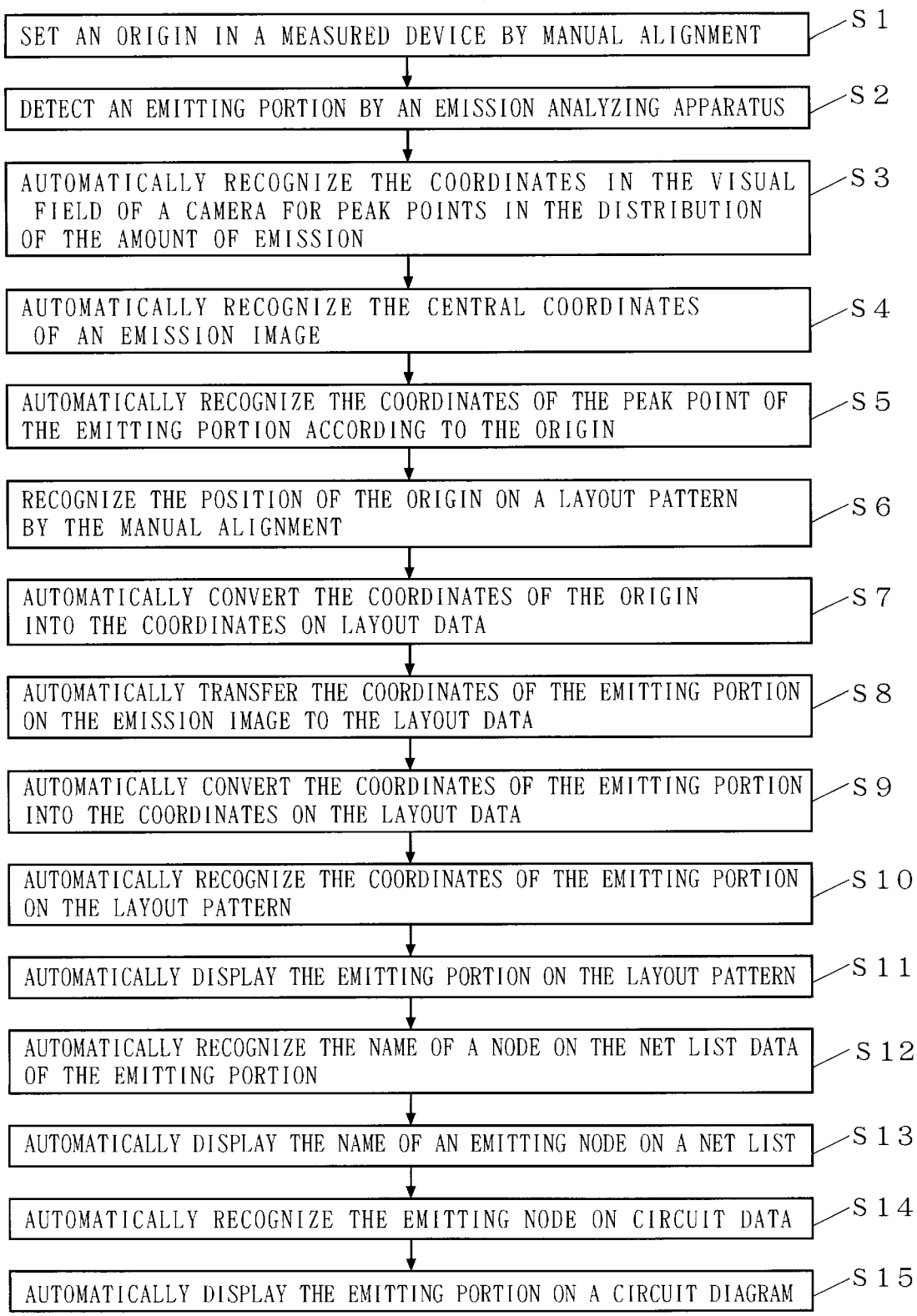
FIG. 2 is a flowchart showing the process flow of the failure analyzing method according to the first embodiment of the present invention.

FIG. 2 is a flowchart showing the process flow of the failure analyzing method according to the first embodiment of the present invention. All automatic processing which will be described below mean the software processing of a computer which can be performed automatically.

Figure 3A:
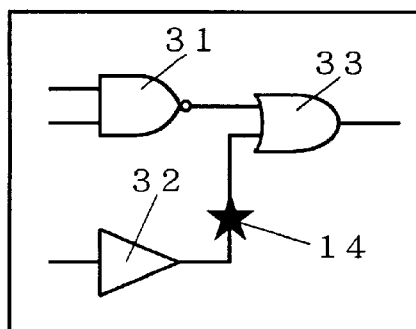
FIGS. 3(a) to 3(d) are diagrams for explaining operation according to the first embodiment of the present invention.

With reference to FIG. 2, an alignment processing for the measured device 3 is manually performed to set a predetermined position in the measured device 3 to an origin at Step S1. As shown in FIG. 3(a), the origin of the measured device 3 is set to correspond to a center 6 of an emission image 5 and the stage coordinates are stored, for example. The stage coordinates are the absolute coordinates which are preset.

At Step S2, emitting portions generated from the failed portions in the measured device 3 are detected by using the emission analyzing apparatus 4 shown in FIG. 1. Assuming that a plurality of emitting portions of the measured device 3 are detected by the emission analyzing apparatus 4, description will be performed below.

Figure 4:
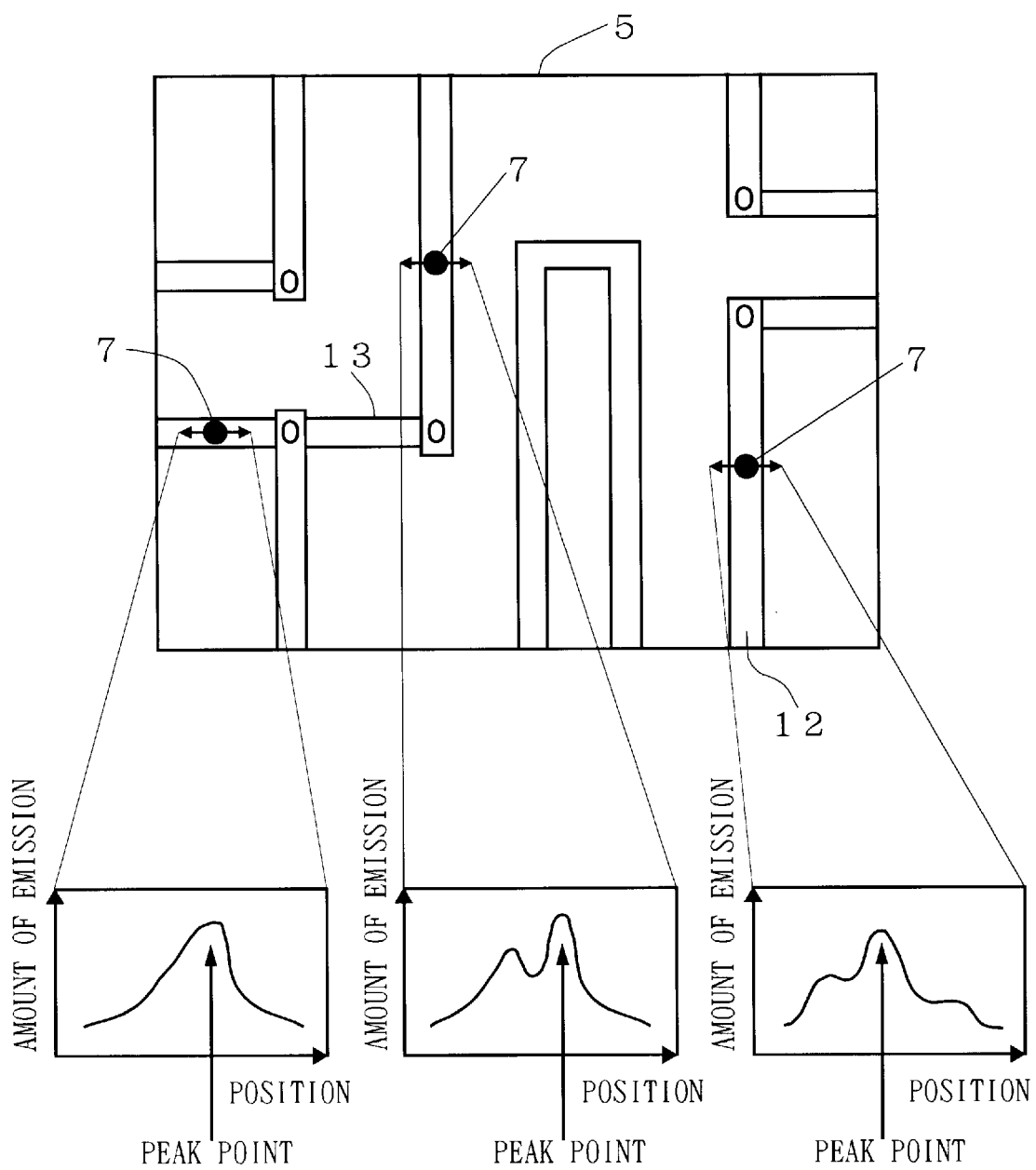
FIG. 4 is a diagram for explaining the operation according to the first embodiment of the present invention.

As shown in FIG. 4, the positional distribution of the amount of emission is measured for a plurality of emitting portions 7 in the measured device 3 and the coordinates in the visual field of a camera (whose center is an origin) for respective peak points are obtained according to the magnification of the camera and the number of pixels at Step S3.

Then, the central coordinates of the emission image 5 are automatically recognized at Step S4. More specifically, the coordinates of the center 6 of the emission image are automatically recognized from the origin of the measured device 3 based on the stage coordinates of the emission image 5 when the emission image 5 is observed in the optional portion of the measured device 3.

At Step S5, the coordinates of respective peak points of the emitting portions 7 are automatically recognized. The coordinates of the peak points of the distribution of the amount of emission in the emitting portion 7 on the emission image 5 from the origin of the measured device 3 are automatically recognized based on the relation in which the coordinates of the center 6 of the emission image are the center of the visual field of the camera. The recognized coordinates act as the coordinates of the emitting portion 7 on the emission image 5.

At Step S6, the position of a layout pattern 8 which corresponds to the origin of the measured device 3 is recognized by a manual alignment processing. For example, movement is performed in such a manner that a center 9 of the layout pattern 8 acts as a temporary origin.

At Step S7, the temporary origin of the layout pattern 8 is automatically converted into the actual coordinates of the layout pattern 8. An actual origin of the layout pattern 8 is preset at the time of design.

At Step S8, the coordinates of the emitting portion 7 on the emission image 5 which are recognized at Step S5 are automatically transferred to data. At Step S9, the coordinates of the emitting portion 7 on the emission image 5 are automatically converted into the coordinates on the layout pattern 8 based on a correlation between the temporary origin of the layout pattern 8 and the actual origin thereof.

Figure 3B:
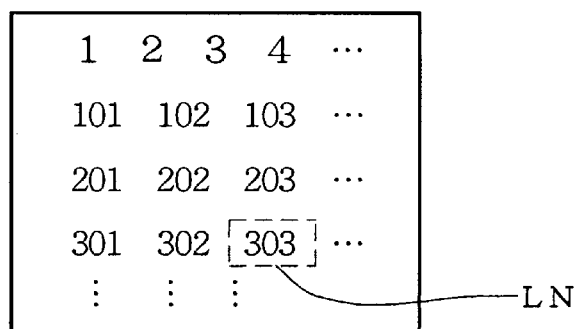
Figure 3C:
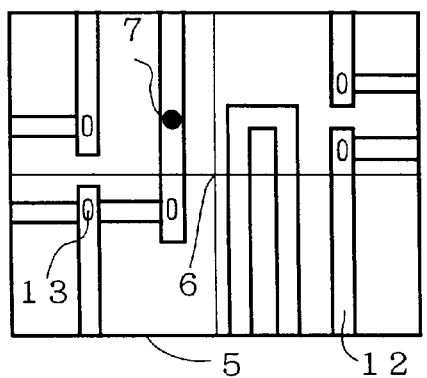
Figure 3D:
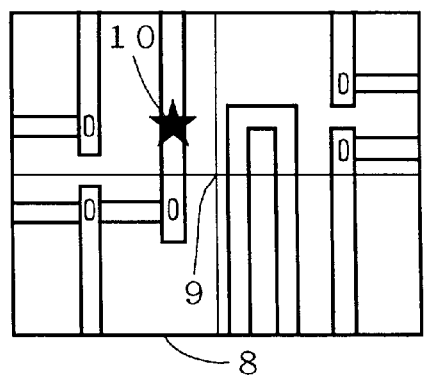

At Step S10, the coordinates of the emitting portion on the layout pattern 8 are recognized. At Step S11, an emitting portion 10 on the layout pattern 8 is automatically displayed by lighting or flashing by using a mark which can be identified as the emitting portion on the layout pattern 8 as shown in FIG. 3(d).

At Step S12, the name of a node (terminal) on a net list which is equivalent to the emitting portion 10 on the layout pattern 8 is automatically recognized according to the coordinates of the emitting portion 10 on the recognized layout pattern 8. The name of a node can be recognized based on the layout pattern—net list corresponding information which is prepared in advance and defines the data corresponding relationship between the coordinates on the layout pattern and the net list. For example, the emitting portion 10 on the layout pattern 8 can be recognized as an emitting node having the name of LN on a net list 11 as shown in FIG. 3(b).

At Step S13, the emitting node on the net list 11 which is recognized at Step S12 is automatically displayed in such a manner that it can be identified visually.

At Step S14, an emitting node on circuit data is automatically recognized according to the emitting node name LN on the recognized net list data. The emitting node on the circuit data can be recognized based on the net list—circuit diagram corresponding information which is prepared in advance and defines the data corresponding relationship between the net list and a circuit diagram. For example, the emitting node name LN on the net list can be recognized as an emitting portion 14 on a circuit diagram CF as shown in FIG. 3(a).

At Step S15, the emitting portion 14 on the circuit diagram CF which is recognized at Step S14 is automatically displayed in such a manner that it can be identified visually.

In the failure analyzing method according to the first embodiment of the present invention, thus, the coordinates of the emitting portion 7 on the emission image 5 which is detected by the emission analyzing apparatus 4 are automatically recognized (Step S5), the same coordinates are automatically converted into the coordinates on the layout pattern (data) (Step S7), the emitting portion 10 on the layout pattern 8 is automatically displayed (Step S11), the node name on the net list (data) of the emitting portion is automatically recognized according to the coordinates on the layout pattern (Step S12), the emitting node name LN is automatically displayed on the net list 11 (Step S13), and the emitting node on the circuit diagram (data) is automatically displayed as the emitting portion 14 on the circuit diagram CF based on the emitting node name LN (Step S15).

Accordingly, a failure analyzer can specify the failed portions with high precision without him(her) depending on the designer of the measured device 3 by using, as analytic materials, the position of the emitting portion of the measured device 3, the position of the emitting portion 10 on the layout pattern 8, the emitting node name LN on the net list 11, and the emitting portion 14 on the circuit diagram CF.

A series of processings are automatically performed by using a computer and the like except for the manual alignment processing. Consequently, it is possible to easily specify the failed portions of the measured device 3 in a short time.

<Second Embodiment>

Figure 5:
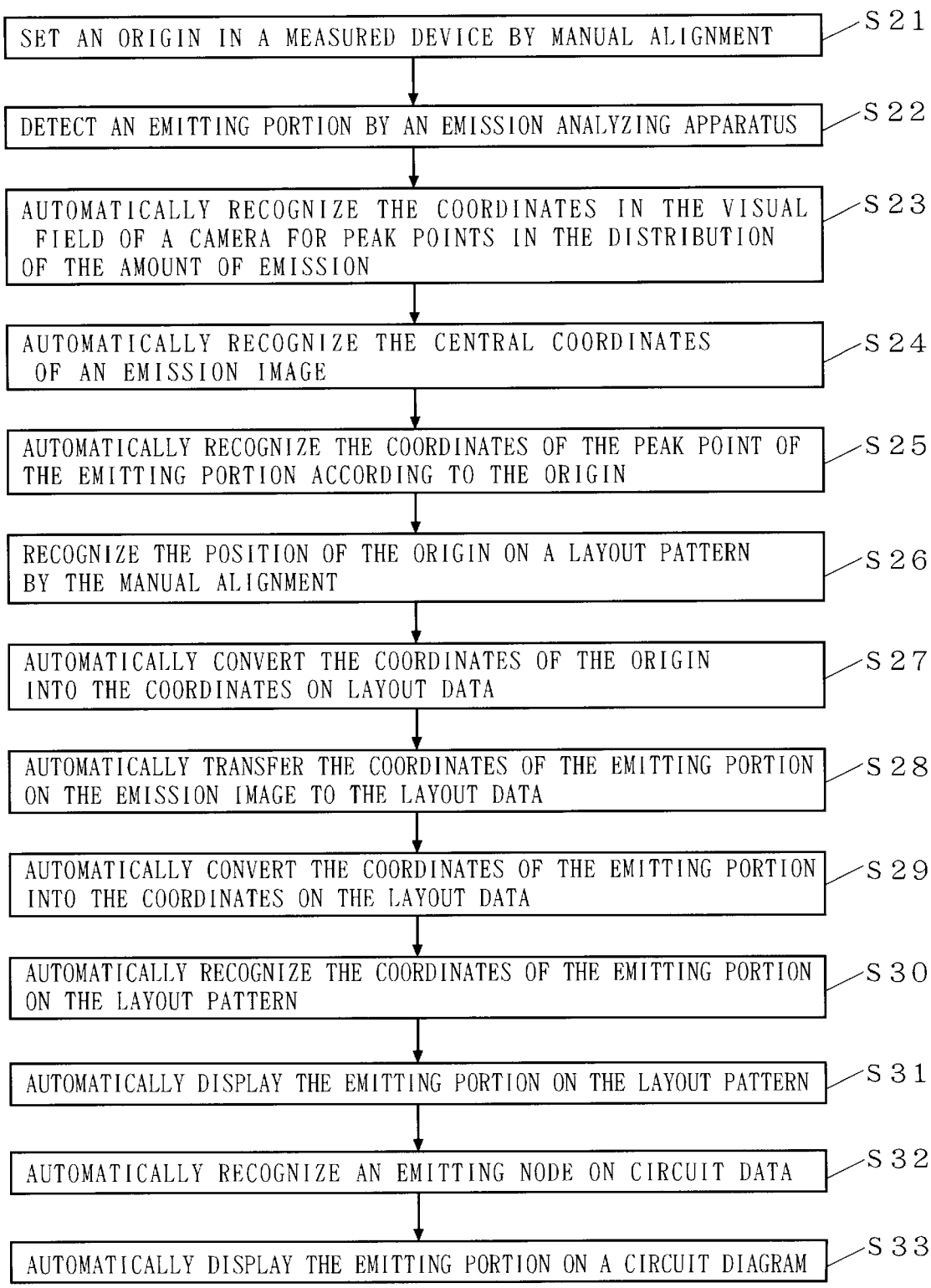
FIG. 5 is a flowchart showing the process flow of a failure analyzing method according to a second embodiment of the present invention.

FIG. 5 is a flowchart showing the process flow of a failure analyzing method according to a second embodiment of the present invention. All automatic processing which will be described below mean the software processing of a computer which can be automatically performed.

With reference to FIG. 5, an alignment processing for a measured device 3 is manually performed to set a predetermined position in the measured device 3 to an origin at Step S21.

At Step S22, emitting portions generated from the failed portions in the measured device 3 are detected by using the emission analyzing apparatus 4 shown in FIG. 1. Assuming that a plurality of emitting portions of the measured device 3 are detected by the emission analyzing apparatus 4, the description will be performed below.

At Step S23, the positional distribution of the amount of emission is measured for a plurality of emitting portions 7 in the measured device 3 and the coordinates in the visual field of a camera (whose center is an origin) for respective peak points are obtained according to the magnification of the camera and the number of pixels as shown in FIG. 4.

Then, the central coordinates of an emission image 5 are automatically recognized at Step S24. More specifically, the coordinates of a center 6 of the emission image are automatically recognized from the origin of the measured device 3 based on the stage coordinates of the emission image 5 when the emission image 5 is observed in an optional portion in the measured device 3.

At Step S25, the coordinates of respective peak points of the emitting portions 7 are automatically recognized. The coordinates of the peak point of the distribution of the amount of emission in the emitting portion 7 on the emission image 5 from the origin of the measured device 3 are automatically recognized based on the relation in which the coordinates of the center 6 of the emission image are the center of the visual field of the camera. The recognized coordinates act as the coordinates of the emitting portions 7 on the emission image 5.

At Step S26, the position of a layout pattern 8 which corresponds to the origin of the measured device 3 is recognized by a manual alignment processing.

At Step S27, the temporary origin of the layout pattern 8 is automatically converted into the actual coordinates of the layout pattern 8.

At Step S28, the coordinates of the emitting portions 7 on the emission image 5 which are recognized at Step S25 are automatically transferred to data. At Step S29, the coordinates of the emitting portions 7 on the emission image 5 are automatically converted into the coordinates on the layout pattern 8 based on a correlation between the temporary origin of the layout pattern 8 and the actual origin thereof.

At Step S30, the coordinates of the emitting portions on the layout pattern 8 are recognized. At Step S31, an emitting portion 10 on the layout pattern 8 is automatically displayed by lighting or flashing by using a mark which can be identified as the emitting portion on the layout pattern 8 as shown in FIG. 3(d).

At Step S32, an emitting node on circuit data is automatically recognized according to the emitting portion 10 on the recognized layout pattern 8. The emitting node on the circuit data can be recognized based on the layout pattern—circuit diagram corresponding information which is prepared in advance and defines the data corresponding relationship between the layout pattern 8 and the circuit diagram. For example, the emitting portion 10 on the layout pattern 8 is directly recognized as an emitting portion 14 on a circuit diagram CF as shown in FIG. 3(a).

At Step S33, the emitting portion 14 on the circuit diagram CF which is recognized at Step S32 is displayed in such a manner that it can be identified visually.

In the failure analyzing method according to the second embodiment of the present invention, thus, the coordinates of the emitting portions 7 on the emission image 5 which are detected by the emission analyzing apparatus 4 are automatically recognized (Step S25), the same coordinates are automatically converted into the coordinates on the layout pattern (Step S27), the emitting portion 10 on the layout pattern 8 is automatically displayed (Step S31), and the emitting node on the circuit diagram is automatically displayed as the emitting portion 14 on the circuit diagram CF based on the coordinates on the layout pattern (Step S33).

Accordingly, a failure analyzer can specify the failed portions with high precision without him(her) depending on the designer of the measured device 3 by using, as analytic materials, the position of the emitting portion of the measured device 3, the position of the emitting portion 10 on the layout pattern 8, and the emitting portion on the circuit diagram.

A series of processings are automatically performed by using a computer and the like except for the manual alignment processing. Consequently, it is possible to easily specify the failed portions of the measured device 3 in a short time.

In the failure analyzing method according to the second embodiment, the emitting node on the circuit diagram is directly recognized according to the emitting portion on the layout pattern without using the net list. Consequently, it is possible to reduce the time for recognizing the emitting portion on the circuit diagram.

<Third Embodiment>

Figure 6:
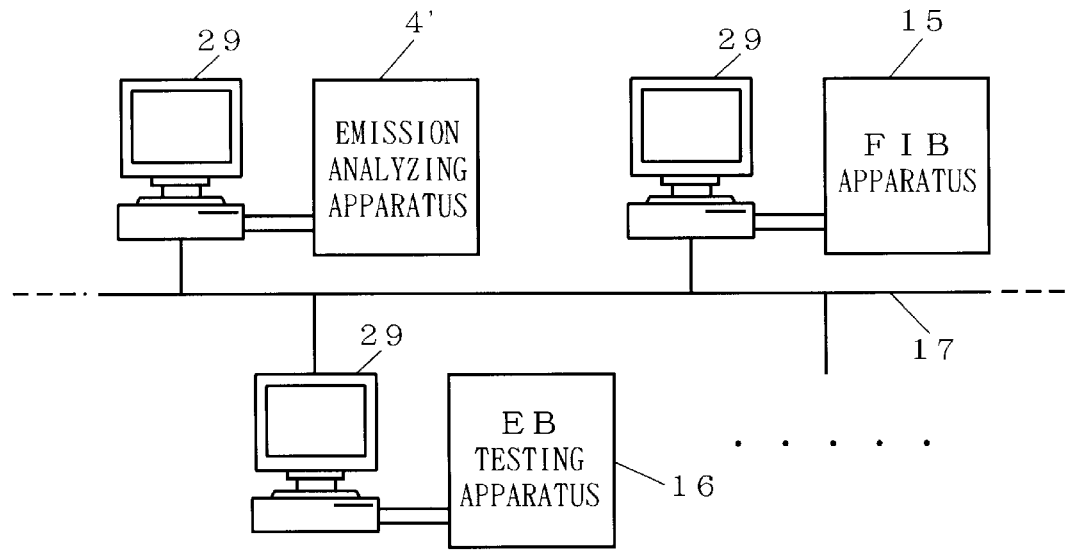
FIG. 6 is a diagram showing the structure of a failure analyzing network system according to a third embodiment of the present invention.

FIG. 6 is a diagram showing the structure of a failure analyzing network system according to a third embodiment of the present invention. As shown in FIG. 6, semiconductor failure analyzing apparatus such as an emission analyzing apparatus 4', a FIB (focusing ion beam) apparatus 15, an EB (electron beam) testing apparatus 16 and the like are mutually connected through a network bus 17 to form a network system. The coordinate data of a failed portion (an emitting portion) detected by any of the failure analyzing apparatus 4', 15 and 16 are transferred to other semiconductor analyzing apparatus through the network bus 17. The same coordinate data are shared with other semiconductor analyzing apparatus. The emission analyzing apparatus 4' comprises a computer 29, and has the failure analyzing function described in the first or second embodiment. The FIB apparatus 15 and the EB testing apparatus 16 also comprise the computer 29 respectively, and have the existing failure analyzing function.

The failure analyzing network system according to the third embodiment forms a network among a plurality of failure analyzing apparatus to exchange coordinate data and the like among the failure analyzing apparatus bidirectionally. Consequently, the failure (defect) detection information detected by each failure analyzing apparatus can be shared immediately. Thus, failure analysis can be performed rapidly, efficiently and easily.

<Fourth Embodiment>

Figure 7:
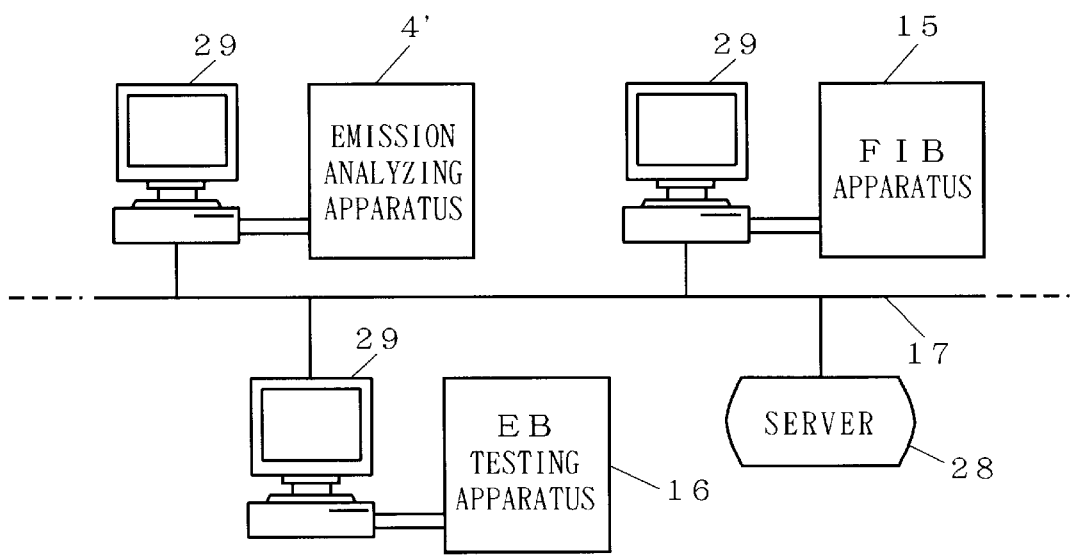
FIG. 7 is a diagram showing the structure of a failure analyzing network system according to a fourth embodiment of the present invention.

A failure analyzing network system according to a fourth embodiment is obtained by forming a network on the failure analyzing network system shown in FIG. 6, wherein CAD navigation software that implements the failure analyzing method according to the first or second embodiment by a software processing is stored in a server 28 so as to be shared by each failure analyzing apparatus as shown in FIG. 7. More specifically, the CAD navigation software is a program in which emission images (including SEM images and FIB images) can correspond to CAD data (a layout pattern, a net list, a circuit diagram and the like).

The failure analyzing network system according to the fourth embodiment can analyze failures based on the emission images obtained from an emission analyzing apparatus 4' by the remote operation in which one of a plurality of failure analyzing apparatus executes the CAD navigation software.

In the failure analyzing network system according to the fourth embodiment, thus, the CAD navigation software can be shared on the network so that cost can be reduced by the unification of the environment for analysis and the shared software (CAD navigation software) in addition to the effects obtained in the third embodiment.

<Fifth Embodiment>

Figure 8:
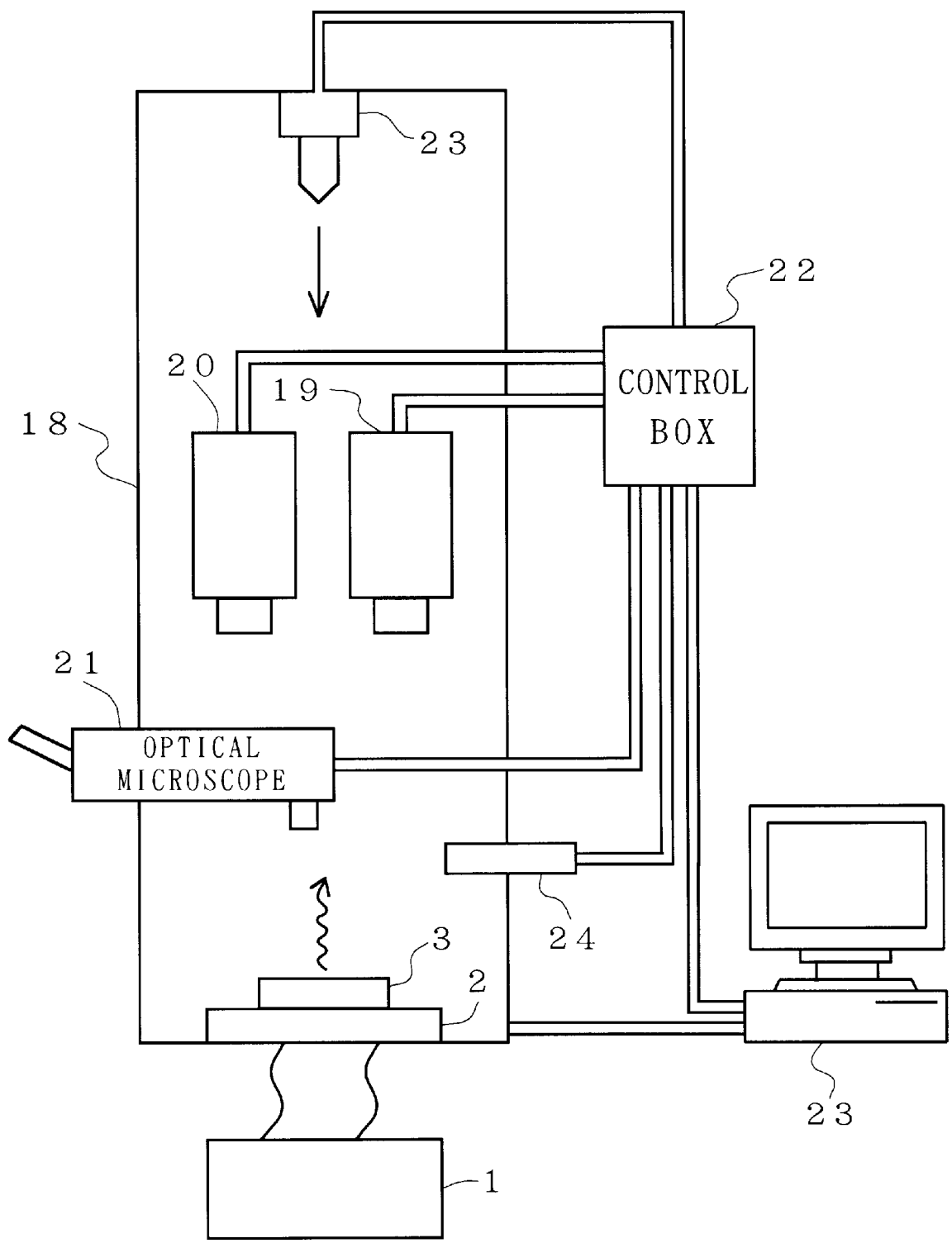
FIG. 8 is a diagram showing the structure of an EB testing apparatus according to a fifth embodiment of the present invention.

FIG. 8 is a diagram showing the structure of an EB testing apparatus according to a fifth embodiment of the present invention. As shown in FIG. 8, a vacuum chamber 18 has a structure in which a measured device 3 provided on a DUT board 2 is arranged therein, and an image intensifier camera 19, a CCD camera 20 and an optical microscope 21 are provided above the measured device 3. These devices 19 to 21 are controlled by a control box 22. It is possible to operate the vacuum chamber 18 and the control box 22 by a controller EWS (Engineering Work Station) 23.

The reference numeral 24 designates a secondary electron detector. The reference numeral 25 designates an electron gun. Electron beams are irradiated from the electron gun 25 onto the measured device 3. Secondary electrons generated in a portion onto which the electron beams are irradiated are detected by the secondary electron detector 24. The EB test can be performed by measuring the voltage of a circuit based on the change of energy of the detected secondary electrons. The secondary electron detector 24 and the electron gun 25 are also controlled by the control box 22.

The image intensifier camera 19 and the CCD camera 20 are used to acquire emission images. The optical microscope 21 is used for the alignment of the measured device 3 and the like. The controller EWS 23 executes and controls the automatic processing portion in the failure analyzing methods according to the first and second embodiments and an automatic processing portion in the EB test.

The EB testing apparatus having such a structure can perform emission analysis together with the ordinary EB test based on the emitting portion of the measured device 3 which is detected by the image intensifier camera 19 or the CCD camera 20 in the vacuum chamber 18.

In the EB testing apparatus according to the fifth embodiment, consequently, it is possible to switch EB testing analysis and the failure analyzing methods according to the first and second embodiments under the same environment for the same measured device 3 without taking the measured device (semiconductor device) 3 out of the vacuum chamber 18.

As a result, a failure analyzing apparatus has two analyzing functions so that cost can be reduced. In addition, the environment for analysis is unified so that the analysis can be performed rapidly, efficiently and easily and operating properties can be enhanced.

While the invention has been described in detail, the foregoing description is in all aspects illustrative and not restrictive. It is understood that numerous other modifications and variations can be devised without departing from the scope of the invention.

I claim:

1. A method for analyzing the failure of a measured device, comprising the steps of:

(a) setting a predetermined two-dimensional position to an origin in said measured device;

(b) obtaining an emission image when operating said measured device by using an emission analyzing apparatus to detect the emitting portion of said measured device according to said emission image; and (c) recognizing measured device emitting coordinates which are the coordinates of said emitting portion from said origin on the basis of the positional relationship between said emission image and said origin.

2. The method for analyzing the failure of a measured device as defined in claim 1, further comprising the steps of:

(d) recognizing the relative positional relationship between a layout pattern, which corresponds to said measured device, and said measured device;

(e) recognizing a position of said emitting portion on said layout pattern on the basis of said relative positional relationship recognized at said step (d); and (f) displaying the position of said emitting portion on said layout pattern in such a manner that it can be recognized visually.

3. The method for analyzing the failure of a measured device as defined in claim 2, further comprising the steps of:

(g) recognizing an emitting node on a net list which is equivalent to said emitting portion on the basis of layout pattern—net list corresponding information which defines the corresponding relationship between said net list and said layout pattern which correspond to said measured device; and (h) displaying said emitting node on said net list in such a manner that it can be recognized visually.

4. The method for analyzing the failure of a measured device as defined in claim 3, further comprising the steps of:

(i) recognizing a position on a circuit diagram which is equivalent to said emitting node on the basis of net list—circuit diagram corresponding information which defines the relationship between said circuit diagram and said net list which correspond to said measured device; and (j) displaying said emitting portion on said circuit diagram in such a manner that it can be recognized visually.

5. The method for analyzing the failure of a measured device as defined in claim 2, further comprising the steps of:

(g) recognizing an emitting node on a circuit diagram which is equivalent to said emitting portion on the basis of layout pattern—circuit diagram corresponding information which defines the relationship between said circuit diagram and said layout pattern which correspond to said measured device; and (h) displaying said emitting node on said circuit diagram in such a manner that it can be recognized visually.

6. The method for analyzing the failure of a measured device as defined in claim 2, wherein:

step (d) comprises recognizing the relative positional relationship between stored design layout pattern data, which corresponds to said measured device, and said measured device; and step (e) comprises recognizing a position of said emitting portion on said design layout pattern data on the basis of said relative positional relationship recognized at said step (d).

7. A failure analyzing apparatus, comprising:

electron beam testing means for irradiating electron beams onto a measured device to detect secondary electrons generated in a portion onto which said electron beams are irradiated, and testing said measured device on the basis of the detected secondary electrons;

emitting portion detecting means for obtaining the emission image of said measured device during operation to detect the emitting portion of said measured device according to said emission image; and housing means for housing said electron beam testing means and said emitting portion detecting means in such a manner that said test can be executed by said electron beam testing means and said emitting portion can be detected by said emitting portion detecting means under the same environment for the same measured device.

8. A failure analyzing system comprising a plurality of failure analyzing apparatuses which can analyze the failure of a measured device respectively, said plurality of failure analyzing apparatuses including at least one failure analyzing apparatus for emission images which can obtain emission images during the operation of said measured device to execute a method for analyzing the failure of a measured device on the basis of said emission images, said method comprising the steps of:

(a) setting a predetermined two-dimensional position to an origin in said measured device;

(b) obtaining an emission image when operating said measured device by using an emission analyzing apparatus to detect the emitting portion of said measured device according to said emission image; and (c) recognizing measured device emitting coordinates which are the coordinates of said emitting portion from said origin on the basis of the positional relationship between said emission image and said origin.

wherein a network is formed among said plurality of failure analyzing apparatus.

9. The failure analyzing system as defined in claim 8, wherein a failure analyzing program, which can execute said method for analyzing the failure of a measured device is shared on said network.

10. The failure analyzing system as defined in claim 8, wherein said method further comprises the steps of:

(d) recognizing the relative positional relationship between a layout pattern, which corresponds to said measured device, and said measured device; and (e) recognizing a position of said emitting portion on said layout pattern on the basis of said relative positional relationship recognized at said step (d); and (f) displaying the position of said emitting portion on said layout pattern in such a manner that it can be recognized visually.

11. The failure analyzing system as defined in claim 10, wherein:

step (d) comprises recognizing the relative positional relationship between stored design layout pattern data, which corresponds to said measured device, and said measured device; and step (e) comprises recognizing a position of said emitting portion on said design layout pattern data on the basis of said relative positional relationship recognized at said step (d).

* * * * *